United States Patent
Lim

(10) Patent No.: US 7,507,647 B2
(45) Date of Patent: Mar. 24, 2009

(54) METHOD OF MANUFACTURING A HIGH VOLTAGE SEMICONDUCTOR DEVICE INCLUDING A DEEP WELL AND A GATE OXIDE LAYER SIMULTANEOUSLY

(75) Inventor: Tae-Hong Lim, Incheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/313,693

(22) Filed: Dec. 22, 2005

(65) Prior Publication Data

US 2006/0134850 A1    Jun. 22, 2006

(30) Foreign Application Priority Data

Dec. 22, 2004    (KR) .................. 10-2004-0110626

(51) Int. Cl.
*H01L 21/425*    (2006.01)
(52) U.S. Cl. .................. 438/530; 438/221; 438/224; 438/404; 438/424; 438/517; 438/526; 438/527; 438/631; 438/660; 438/787
(58) Field of Classification Search .................. 438/404, 438/424, 514, 517, 585, 631, 660, FOR. 388, 438/FOR. 395, 787, 791, 218, 221, 223, 224, 438/526, 527, 530
See application file for complete search history.

(56) References Cited

U.S. PATENT DOCUMENTS

| 4,997,782 | A  | * | 3/1991 | Bergonzoni | 438/227 |
|---|---|---|---|---|---|
| 5,888,873 | A  | * | 3/1999 | Krivokapic | 438/307 |
| 6,534,828 | B1 | * | 3/2003 | Kocon | 257/341 |
| 7,001,812 | B2 | * | 2/2006 | Noda et al. | 438/275 |
| 7,087,470 | B2 | * | 8/2006 | Anderson et al. | 438/157 |
| 2004/0058502 | A1 | * | 3/2004 | Cai et al. | 438/309 |
| 2005/0148138 | A1 | * | 7/2005 | Noda et al. | 438/216 |

* cited by examiner

*Primary Examiner*—N Drew Richards
*Assistant Examiner*—Joannie A Garcia
(74) *Attorney, Agent, or Firm*—Lowe Hauptman Ham & Berner, LLP

(57) ABSTRACT

A method of manufacturing a high voltage semiconductor device including forming a P-type region implanted with P-type impurities and an N-type region implanted with N-type impurities in a silicon substrate. The method further includes forming a silicon nitride layer pattern and a pad oxide layer pattern to expose a surface of the silicon substrate, forming a trench by etching the exposed silicon substrate using the silicon nitride layer pattern as an etch mask, forming a trench oxide layer pattern in the trench by removing the silicon nitride layer pattern and the pad oxide layer pattern, and simultaneously forming a deep P-well and a deep N-well by driving P-type impurities in the P-type region and N-type impurities in the N-type region into the silicon substrate, while forming a gate oxide layer on a silicon substrate including the trench oxide layer pattern.

5 Claims, 4 Drawing Sheets

METHOD OF MANUFACTURING A HIGH VOLTAGE SEMICONDUCTOR DEVICE INCLUDING A DEEP WELL AND A GATE OXIDE LAYER SIMULTANEOUSLY

CROSS-REFERENCE TO RELATED APPLICATION

This application claims priority to and the benefit of Korean Patent Application No. 10-2004-0110626 filed in the Korean Intellectual Property Office on Dec. 22, 2004, the entire contents of which are incorporated herein by reference.

BACKGROUND OF THE INVENTION (a) Field of the Invention

The present invention relates to a method of manufacturing a high voltage semiconductor device, and more particularly to a method of manufacturing a high voltage semiconductor device including a deep well and a gate oxide layer.

(b) Description of the Related Art

Generally, a high voltage semiconductor device is provided with a P-well and an N-well in a silicon substrate. The P-well is formed by implanting P-type impurities into a silicon substrate and then driving P-type impurities into the silicon substrate through annealing the silicon substrate at a high temperature. In addition, the N-well is formed by implanting N-type impurities into a silicon substrate and then driving N-type impurities into the silicon substrate through annealing the silicon substrate at a high temperature.

However, a total manufacturing time of a high voltage semiconductor device may become longer because each drive-in process for forming the P-well and N-well takes a long time to complete and each process should be performed separately.

The above information described in this Background section is only for enhancement of understanding of the background of the invention and therefore it may contain information that does not form prior art with respect to the present invention.

SUMMARY OF THE INVENTION

The present invention has been made in an effort to provide a method of manufacturing a high voltage semiconductor device having advantages of improving problems caused by a drive-in process for forming a P-well and an N-well.

An exemplary method of manufacturing a high voltage semiconductor device according to an embodiment of the present invention includes: forming a P-type region implanted with P-type impurities and an N-type region implanted with N-type impurities in a silicon substrate; forming a silicon nitride layer pattern and a pad oxide layer pattern to expose a surface of the silicon substrate; forming a trench by etching the exposed silicon substrate using the silicon nitride layer pattern as an etch mask; forming a trench oxide layer pattern on the trench by removing the silicon nitride layer pattern and the pad oxide layer pattern; and simultaneously forming a deep P-well and a deep N-well by driving P-type impurities in the P-type region and N-type impurities in the N-type region into the silicon substrate, while forming a gate oxide layer on a silicon substrate including the trench oxide layer pattern.

Therefore, since the deep P-well and the deep N-well are formed simultaneously during a gate forming process, a time for a drive-in process for forming a well can be reduced. Consequently, a total manufacturing time of a high voltage semiconductor device can also be reduced.

DETAILED DESCRIPTION OF THE EMBODIMENTS

An exemplary embodiment of the present invention will hereinafter be described in detail with reference to the accompanying drawings.

FIG. 1 to FIG. 7 are cross-sectional views showing sequential stages of a method of manufacturing a high voltage semiconductor device according to an exemplary embodiment of the present invention.

Figure 1:
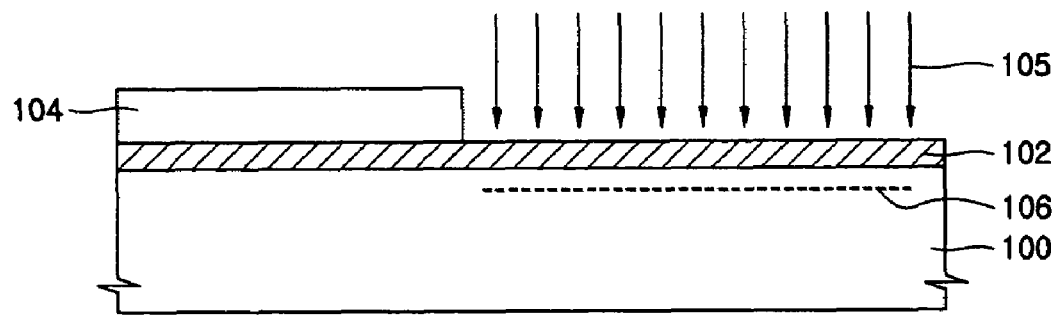
FIG. 1 to FIG. 7 are cross-sectional views showing sequential stages of a method of manufacturing a high voltage semiconductor device according to an exemplary embodiment of the present invention.

Referring to FIG. 1, a buffer oxide layer 102 is formed on a silicon substrate 100. Subsequently, a first mask pattern 104 exposing a first region of the buffer oxide layer 102 is formed on the buffer oxide layer 102. Thereafter, a P-type region 106 is formed within the silicon substrate 100 by implanting P-type impurities 105 using the first mask pattern 104 as an ion implantation mask.

Figure 2:
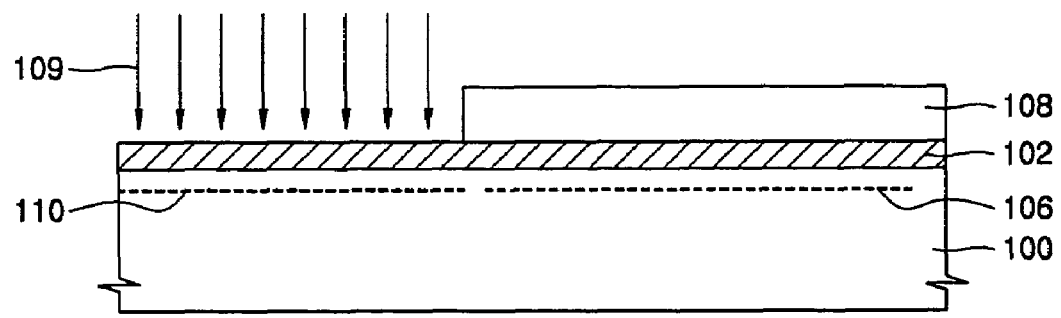

Referring to FIG. 2, the first mask pattern 104 is removed. Subsequently, a second mask pattern 108 exposing a second region of the buffer oxide layer 102 is formed on the buffer oxide layer 102. Thereafter, an N-type region 110 is formed within the silicon substrate 100 by implanting N-type impurities 109 using the second mask pattern 108 as an ion implantation mask, and then the buffer oxide layer 102 is removed.

Figure 3:
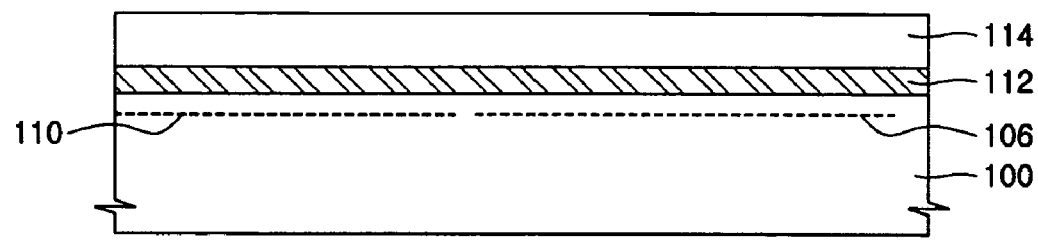

Referring to FIG. 3, a pad oxide layer 112 and a silicon nitride layer 114 are sequentially formed on a silicon substrate 100 including the P-type region 106 and N-type region 110. The pad oxide layer 112 and the silicon nitride layer 114 are formed in order to perform a subsequent process of device isolation.

Figure 4:
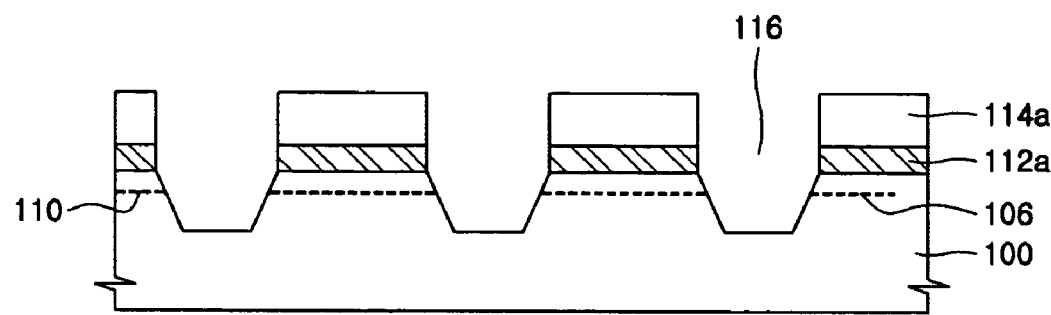

Referring to FIG. 4, a silicon nitride layer pattern 114a and a pad oxide layer pattern 112a are formed by patterning the silicon nitride layer 114 and the pad oxide layer 112 to a degree that a surface of the silicon substrate 100 is exposed. Subsequently, a trench 116 is formed by etching the exposed silicon substrate 100 using the silicon nitride layer pattern 114a as an etch mask.

Figure 5:
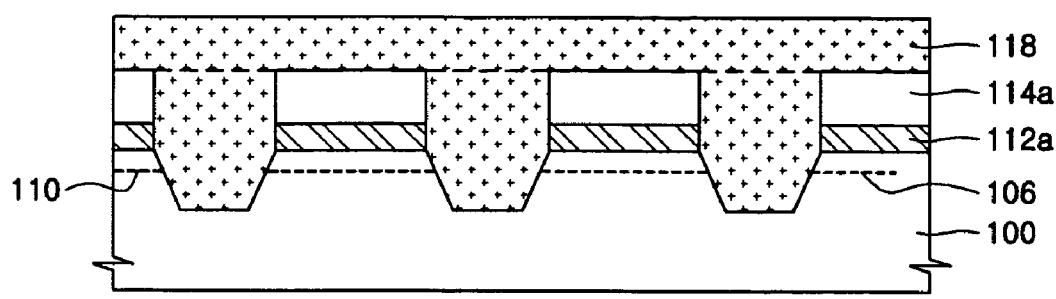
Figure 6:
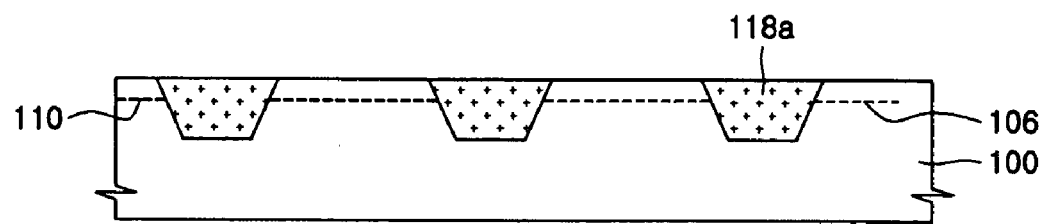

Referring to FIG. 5 and FIG. 6, a trench oxide layer 118 is formed so as to fill in the trench 116. Subsequently, the trench oxide layer 118 is etched by chemical mechanical polishing to a degree that a surface of the silicon nitride layer pattern 114a is exposed.

Thereafter, the silicon nitride layer pattern 114a and pad oxide layer pattern 112a are removed by etching them. Therefore, device isolation is completed when a trench oxide layer pattern 118a is formed on the trench 116.

Figure 7:
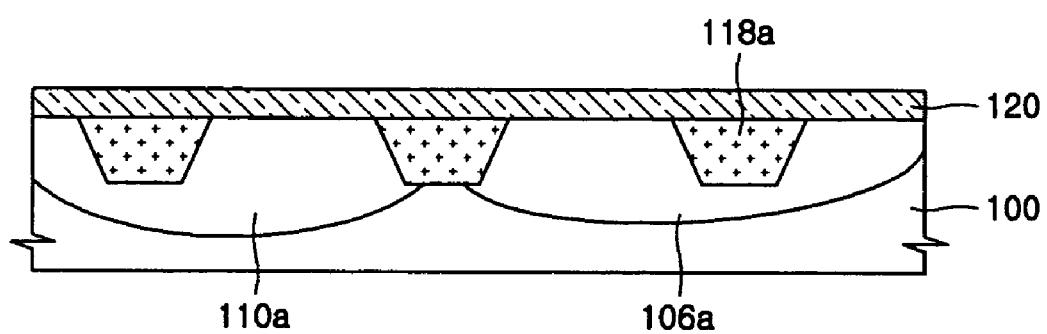

Referring to FIG. 7, a P-well 106a and an N-well 110a are simultaneously formed when a gate oxide layer 120 is formed on a silicon substrate 100 including the trench oxide layer pattern 118a. That is, during an anneal step for forming the gate oxide layer 120, the deep P-well 106a and N-well 110a are simultaneously formed by performing a drive-in process in which P-type impurities in the P-type region 106 and N-type impurities in the N-type region 110 are driven into the silicon substrate 100.

According to an exemplary embodiment of the present invention, during an anneal step for forming a gate oxide layer, a P-well and an N-well are simultaneously formed by performing a drive-in process in which P-type impurities in the P-type region and N-type impurities in the N-type region are driven into the silicon substrate. Therefore, a total manufacturing time of a high voltage semiconductor device can be reduced because the number of processes is shortened. In addition, investment costs for unnecessary facilities and product material costs can be saved.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method of manufacturing a high voltage semiconductor device, comprising:
    forming a buffer oxide layer on the silicon substrate;
    forming a first mask pattern to expose a first region of the buffer oxide layer;
    forming the P-type region in the silicon substrate by implanting P-type impurities using the first mask pattern as an ion implantation mask;
    removing the first mask pattern;
    forming a second mask pattern to expose a second region of the buffer oxide layer; and
    forming the N-type region in the silicon substrate by implanting N-type impurities using the second mask pattern as an ion implantation mask;
    forming a silicon nitride layer pattern and a pad oxide layer pattern to expose a surface of the silicon substrate;
    forming a trench by etching the exposed silicon substrate using the silicon nitride layer pattern as an etch mask;
    forming a trench oxide layer pattern in the trench, comprising:
    forming a trench oxide layer so as to fill in the trench;
    performing chemical mechanical polishing to the trench oxide layer so as to expose a surface of the silicon nitride layer pattern; and
    removing the silicon nitride layer pattern and pad oxide layer pattern by etching them; and
    simultaneously forming a deep P-well and a deep N-well by driving P-type impurities in the P-type region and N-type impurities in the N-type region into the silicon substrate, respectively, while forming a gate oxide layer on the silicon substrate including the trench oxide layer pattern.

2. The method of claim 1, wherein the P-well and N-well are formed during an anneal step for forming the gate oxide layer.

3. The method of claim 2, wherein the forming of the P-type region and N-type region comprises:
    forming a buffer oxide layer on the silicon substrate;
    forming a first mask pattern to expose a first region of the buffer oxide layer;
    forming the P-type region in the silicon substrate by implanting P-type impurities using the first mask pattern as an ion implantation mask;
    removing the first mask pattern; forming a second mask pattern to expose a second region of the buffer oxide layer; and
    forming the N-type region in the silicon substrate by implanting N-type impurities using the second mask pattern as an ion implantation mask.

4. The method of claim 1, wherein the forming of the silicon nitride layer pattern and pad oxide layer pattern comprises:
    sequentially forming a pad oxide layer and silicon nitride layer on the silicon substrate including the P-type region and N-type region; and
    exposing the surface of the silicon substrate by patterning the silicon nitride layer and pad oxide layer.

5. The method of claim 2, wherein the forming of the layer pattern and pad oxide layer pattern comprises:
    sequentially forming a pad oxide layer and silicon nitride layer on a silicon substrate including the P-type region and N-type region; and
    exposing the surface of the silicon substrate by patterning the silicon nitride layer and pad oxide layer.

* * * * *